United States Patent [19]
Ando

[11] Patent Number: 5,994,932
[45] Date of Patent: *Nov. 30, 1999

[54] PHASE LOCKED LOOP CIRCUIT AND REPRODUCING APPARATUS PROVIDED WITH THEREOF

[75] Inventor: Ryo Ando, Tokyo, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/970,764

[22] Filed: Nov. 14, 1997

[30] Foreign Application Priority Data

Nov. 29, 1996 [JP] Japan .................................. 8-320462
May 29, 1997 [JP] Japan .................................. 9-140599

[51] Int. Cl.$^6$ ...................................................... H03L 7/06
[52] U.S. Cl. .............................. 327/156; 327/160; 331/25
[58] Field of Search ................................... 327/156, 159, 327/160; 331/1 R, 2, 17, 25

[56] References Cited

U.S. PATENT DOCUMENTS 5,202,906  4/1993  Saito ........................................ 331/14
5,574,757  11/1996  Ogawa .................................... 375/376
5,726,607  3/1998  Brede ........................................ 331/2

*Primary Examiner*—Timothy P. Callahan
*Assistant Examiner*—An T. Luu
*Attorney, Agent, or Firm*—Jay H. Maioli

[57] ABSTRACT

A phase locked loop circuit for extracting a clock component from an input signal and generating a phase locked clock signal. Operates to detect a partial loss of the input signal and keep the input signal of a low-pass filter that is one component of the circuit zero. The clock signal is controlled to be far from an originally assumed signal while a partial loss of the input signal is detected. Hence, the pull-in operation of the PLL is expedited after the normal clock signal can be extracted.

4 Claims, 8 Drawing Sheets

10

PHASE LOCKED LOOP CIRCUIT AND REPRODUCING APPARATUS PROVIDED WITH THEREOF

BACKGROUND OF THE INVENTION

1. Field of the Industrial Application

The present invention relates to a phase locked loop (PLL) circuit and a signal reproducing apparatus for reproducing data with a clock signal supplied by the PLL circuit.

2. Description of the Related Art

When reproducing digital data recorded on a recording medium such as an optical disk, a magnetic disk or a magnetic tape, it is necessary to generate a reproduction clock, that is, a so-called channel clock for pulling a channel bit from a signal read out of the recording medium. For generating a clock, in general, the PLL circuit is used. This PLL circuit may take an analog type or a digital type. The digital PLL circuit basically has the arrangement as shown in FIG. 1.

In FIG. 1, an input terminal 101 is inputted with a signal read from the recording medium such as the so-called EFM (Eight-Fourteen Modulation) signal. This EFM is a modulating system adopted by the so-called CD (compact disk), which operates to modulate 8-bit data into 14-channel bits according to the predetermined modulating rules. The modulated EFM signal includes inverted intervals (inter-edge intervals) in the range of 3T to 11T, where T is a channel bit period and contains a channel clock component.

The digital PLL circuit is arranged to have a phase comparator 102 being inputted with a signal from the input terminal 101, a low-pass filter (LPF) 103, and a variable frequency oscillator (VFO) 104. The output from the VFO 104 is taken as a PLL output clock PLCK at a terminal 105 as well as sent back to the phase comparator 102. The VFO normally uses a voltage controlled oscillator (VCO) for the analog PLL, while for the digital PLL, the VFO uses an oscillator arranged to change a frequency dividing ratio according to input phase error information, such as a number controlled oscillator (NCO).

In the foregoing arrangement, the phase comparator 102 operates to compare the PLL output clock PLCK with the input signal. Then, the compared result is sent to a digital LPF 103 through which a dc signal corresponding to the phase difference is taken out. Based on the phase difference signal, the oscillating frequency of the VFO 104 is controlled so that the resulting PLL output clock PLCK takes synchronization with a channel clock of the input signal (for example, EFM signal).

The phase comparator 102 is arranged as shown in FIG. 2, for example. An input signal (for example, EFM signal) at the input terminal 101 is sent to a first-stage register 121 that is connected in series with a second-stage register 122 and an Exclusive OR gate 123. The output from the register 121 is sent to the register 122 and the Exclusive OR gates 123 and 124. The Exclusive OR gate 124 is inputted with the output from the register 122. The registers 121 and 122 are driven on the PLL output clock PLCK from the terminal 105. The register 122 is inputted with the inverted clock PLCK given by an inverter 125. The output from the Exclusive OR gate 123 is sent to an enable terminal EN of a phase difference counter 126. The output from the gate 123 is inverted by an inverter 128 and then sent to a load control terminal LD. The output from the phase difference counter 126 is sent to a phase register 127. The phase difference counter 126 and the phase register 127 are driven on a master clock MCK sent from a terminal 106. The output from the Exclusive OR gate 124 is sent to a clock terminal of the phase register 127 as a phase register clock. The phase difference data is taken from the phase register 127 through a terminal 107 and then is sent to the LPF 103.

Then, the operation of the phase comparator shown in FIG. 2 will be described with reference to signal waveforms of components shown in FIGS. 3A to 3F.

In a case that the terminal 101 is inputted with the EFM signal as an input signal shown in FIG. 3A and the terminal 105 is inputted with the PLL output clock PLCK shown in FIG. 3B, the Exclusive OR gate 123 operates to output a "H" (High-level "1") signal between a rising time $t_1$ of the EFM signal and a rising time $t_2$, of the PLL output clock PLCK, during which the phase difference counter 126 continues to do a counting operation and then outputs a count signal as shown in FIG. 3D. The Exclusive OR gate 124 operates to output a signal that keeps at high level between the rising time $t_2$ and the falling time $t_3$ of the PLL output clock PLCK as shown in FIG. 3E. The phase register 127 is inputted with the output from the phase difference counter 126 on the rising timing $t_2$ as shown in FIG. 3E, so that the output from the phase register 127 is switched as shown in FIG. 3F at the time $t_2$.

A value to be loaded as initial data from the terminal 108 to the phase difference counter 126 is initialized to such a value as making the counter output value zero when the phase error is zero. The value is shifted to a negative side by a count value corresponding to a half of a period of the PLL output clock PLCK. The master clock MCK supplied to the terminal 106 is normally set as such a frequency as being several times or more as large as the PLL output clock frequency.

The phase difference data from the terminal 107 of the phase comparator as shown in FIG. 2 is sent to the digital LPF as shown in FIG. 4.

The digital LPF shown in FIG. 4 is arranged to have a register 131 on an input side and registers 132 and 133. That is, the phase difference data supplied through the terminal 107 is sent to the register 132 and an adder 136 through the register 131. Then, the output from the register 132 is multiplied by a coefficient from the terminal 135 and then is sent to the adder 136. The output from the adder 136 is sent to an adder 137, the output of which passes through a register 133 and then is multiplied by a coefficient from the terminal 139 through the effect of a multiplier 138. Then, the multiplied result is fed back to the adder 137, and the output of the register 133 is taken through a terminal 140 as an LPF output. These registers 131, 132 and 133 are driven at a filter clock sent from the terminal 110. This clock corresponds to both edges of the PLL output clock PLCK, for example.

The digital LPF operates to take a low-pass component of the phase difference data or the so-called dc component and then apply it to the VFO 104 shown in FIG. 1 as a control voltage.

In case some defects are caused on a recording medium such as a disk by impairments or fingerprints, the edges of the EFM signal read from the medium may be dropped over such a long time as several hundreds micro seconds.

The phase register 127 of the phase comparator shown in FIG. 2 operates to detect the edge of the EFM signal inputted by the registers 121 and 122 and update the phase data as a clock signal. Hence, the drop of the edge of the input signal inhibits to update the phase difference data of the phase register 127. As a result, the phase difference data immediately before the edge of the input signal is dropped is held as it is. The signal level lowered near the defect disallows the edge to be normally detected. Hence, it is more likely that the output from the phase difference counter 126 and the phase difference data from the phase register are greatly disturbed.

Hence, the LPF shown in FIG. 1 is inputted with a value greatly shifted from a center value for a long time, so that the LPF keeps a dc value inside of itself and supplies a dc value. As a result, the oscillating frequency of the VFO 104 shown in FIG. 1 is greatly shifted from the center value.

Afterwards, an optical pickup is departed from the defect of the medium so that the edge of the EFM signal can be properly obtained. Then, the PLL circuit performs a pulling operation. Since the LPF has a great time constant, the PLL circuit disadvantageously needs a long time for pulling in the phase of the signal if the dc value is stored in the filter.

SUMMARY OF THE INVENTION

The present invention is made to overcome the foregoing disadvantage. It is an object of the present invention to provide a PLL circuit and a signal reproducing apparatus which are arranged to prevent a large dc value from being stored in a filter when edges of an input signal cannot be detected for a long time and allow the PLL to quickly do a pull-in when the edges of the input signal can be detected after that.

According to an aspect of the invention, a phase locked loop circuit includes a phase comparator for comparing in phase an input signal with a generated clock signal, a low-pass filter for extracting a low-pass signal of a phase difference signal from the phase comparator, a variable control oscillator for variably adjusting an oscillating frequency according to the low-pass signal extracted from the low-pass filter, and an output for feeding an output from the variable control oscillator as the generated clock signal and further comprises a defect detector for detecting a partial loss of the input signal, and a controller for controlling the phase difference signal inputted to the low-pass filter as zero during the detecting interval of the partial loss of the input signal given by the defect detector.

DESCRIPTION OF THE PREFERRED EMBODIMENT

Hereafter, the description will be oriented to a PLL circuit according to a preferred embodiment of the invention with reference to the appended drawings.

Figure 5:
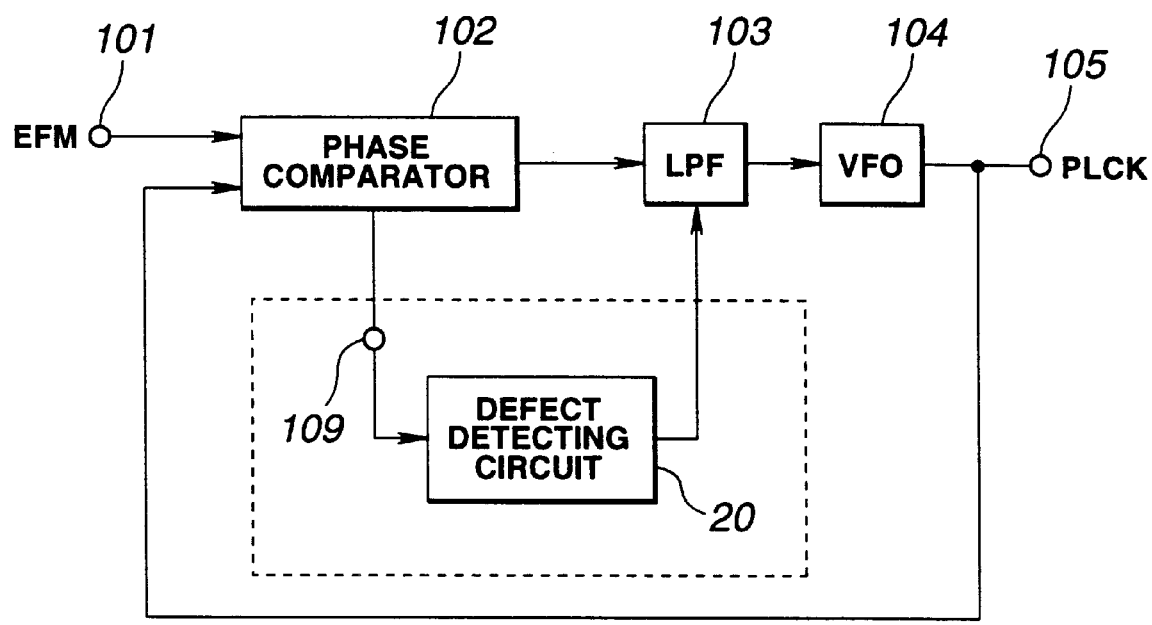
FIG. 5 is a block diagram showing a PLL circuit to which the present invention applies.

FIG. 5 shows a PLL circuit according to the preferred embodiment of the invention.

In FIG. 5, a numeral 101 denotes an input terminal that is inputted with an EFM signal read from a recording medium.

Figure 1:
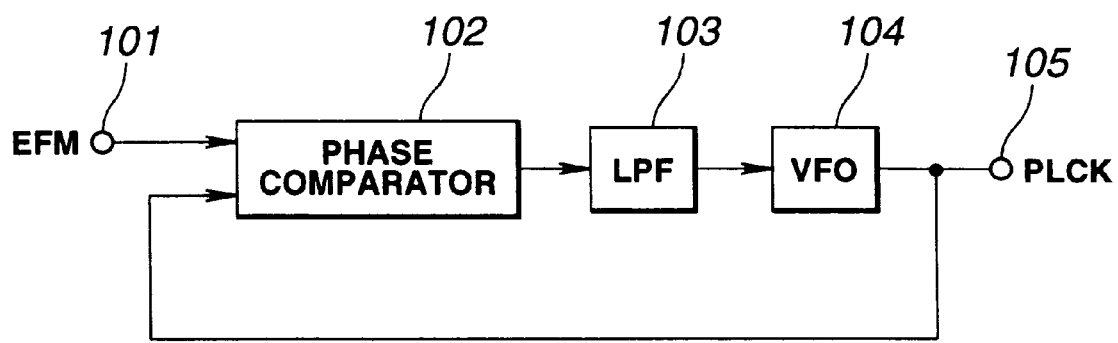
FIG. 1 is a block diagram showing a conventional PLL circuit.

The PLL circuit is arranged to have a phase comparator 102 that is inputted with the EFM signal from the input terminal 101, a LPF (low-pass filter) 103, and a VFO (Variable Frequency Oscillator) 104. The output from the VFO 104 is taken as a PLL output clock PLCK through a terminal 105 and is sent to the phase comparator 102 through a feedback loop. As will be understood from the comparison of FIG. 1 with FIG. 5, the feature of the present invention is a defect detecting circuit 20 enclosed in an alternate long and short dash line. The defect detecting circuit 20 operates to detect a defect of the input signal and controllably keep the LPF 103 constant.

In a case that the PLL circuit according to the present invention is assumed that the oscillating frequency from the VFO 104 is a reference frequency when the phase difference data sent from the phase comparator 102 to the VFO 104 through the LPF 103 is zero, the defect detecting circuit 20 controls the internal state of the LPF 103 so that the output from the LPF 103 is made zero when detecting a defect. The reference frequency corresponds to the so-called free-run frequency or center frequency of the VCO of the analog PLL. The reference frequency is normally set to the frequency of the clock component of the input signal, that is, the channel clock frequency of the input EFM signal.

The phase comparator 102 operates to compare in phase the PLL output clock PLCK with the input signal and then send the compared result to a digital LPF 103 through which a dc signal corresponding to the phase difference is taken out. According to the phase difference signal, the oscillating frequency of the VFO 104 is controlled so that the PLL output clock PLCK takes synchronization with the channel clock of the EFM signal to be inputted to the PLL circuit. The defect detecting circuit 20 operates to output the detection signal when an edge of the input signal cannot be detected for a certain time and a control signal such as a register clear signal to be discussed below to the LPF 103.

Figure 2:
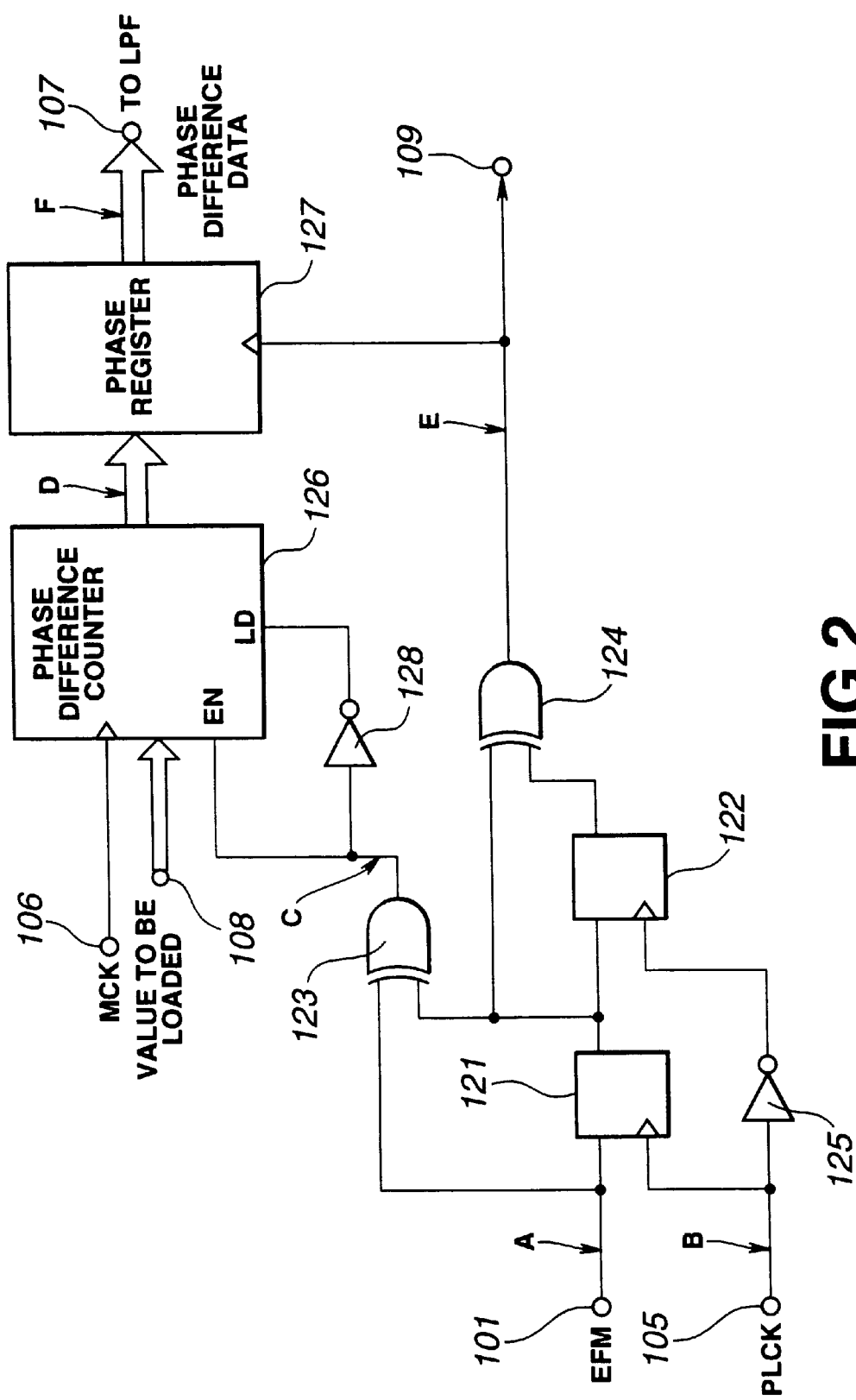
FIG. 2 is a block diagram showing an internal arrangement of a conventional phase comparator.
Figure 3:
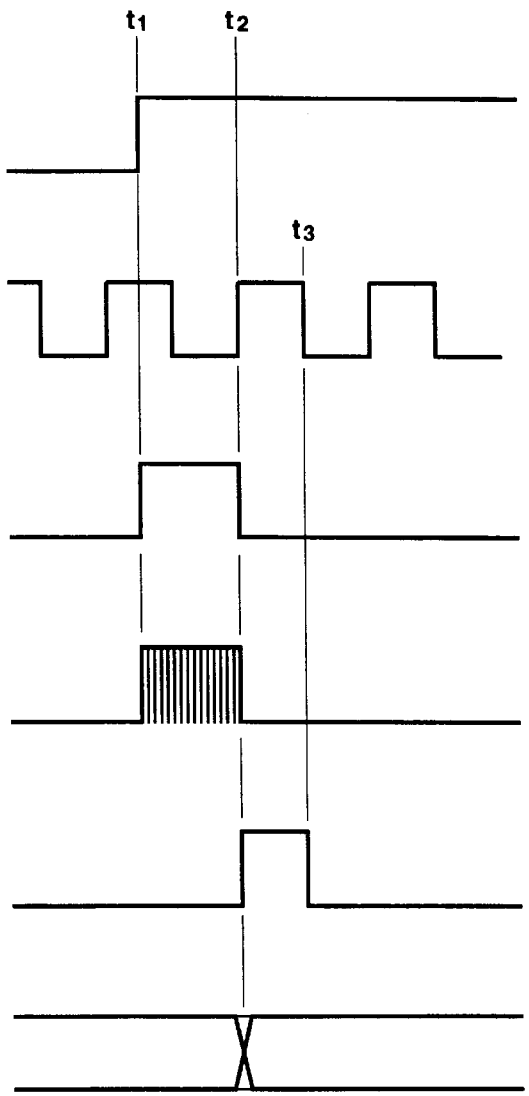
FIG. 3A is a timing chart showing an EFM signal to be inputted to the PLL circuit.
FIG. 3B is a timing chart of a PLCK signal.
FIG. 3C is a timing chart showing an output signal of an Exclusive OR gate 123.
FIG. 3D is a timing chart of an output signal of a phase difference counter 126.
FIG. 3E is a timing chart of an output signal of an Exclusive OR gate 124.
FIG. 3F is a timing chart of an output signal of a phase difference register 127.
Figure 4:
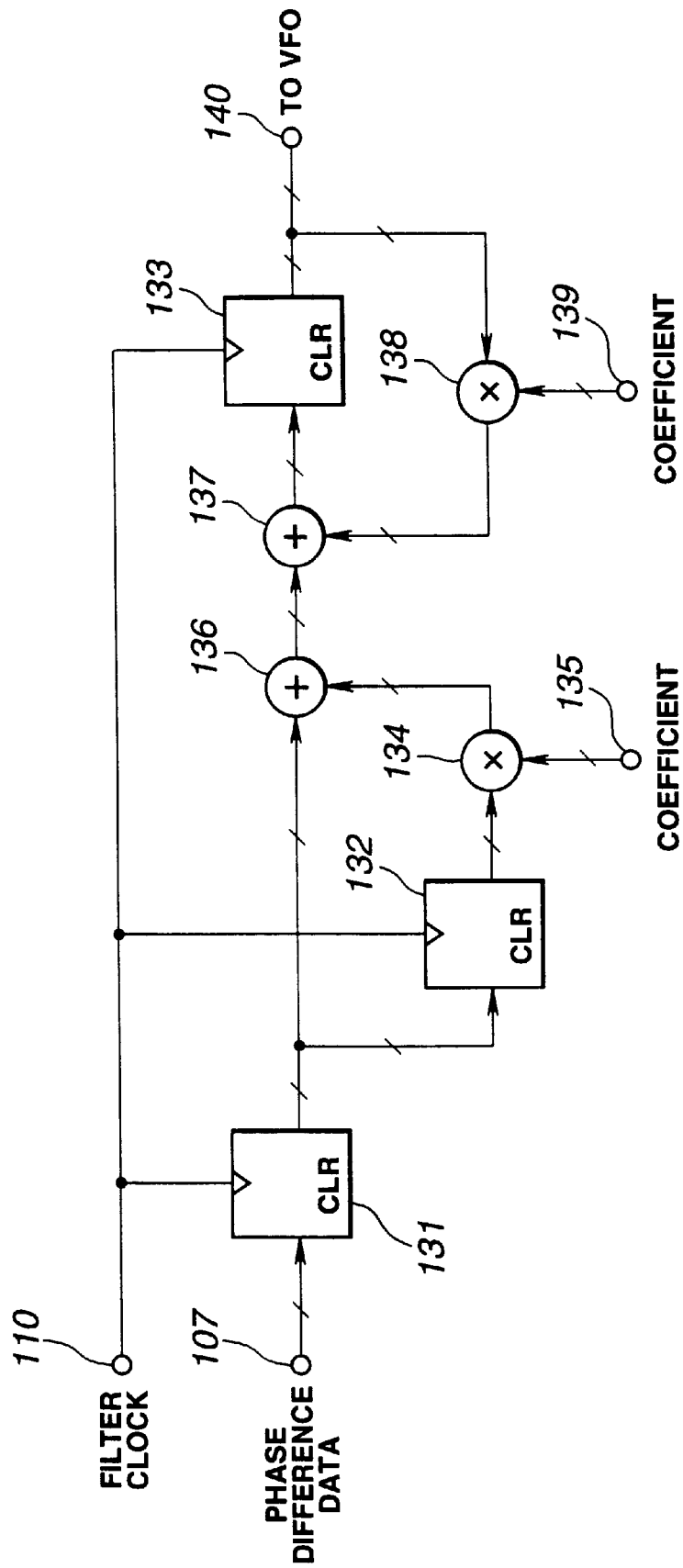
FIG. 4 is a block diagram showing an internal arrangement of a low-pass filter 103 shown in FIG. 1.

The phase comparator 102 is arranged as shown in FIG. 2. A phase difference counter 126 shown in FIG. 2 operates to count a master clock MCK only for a period corresponding to a phase difference between the edge of the EFM signal and the PLL output clock PLCK. Then, a phase register 127 latches the master clock MCK and then sends the phase difference data to the digital LPF 103. Further, a signal from a terminal 109 of the phase comparator 102, that is, a phase register clock from the Exclusive OR gate 124 shown in FIG. 2 is sent to the defect detecting circuit 20.

Figure 6:
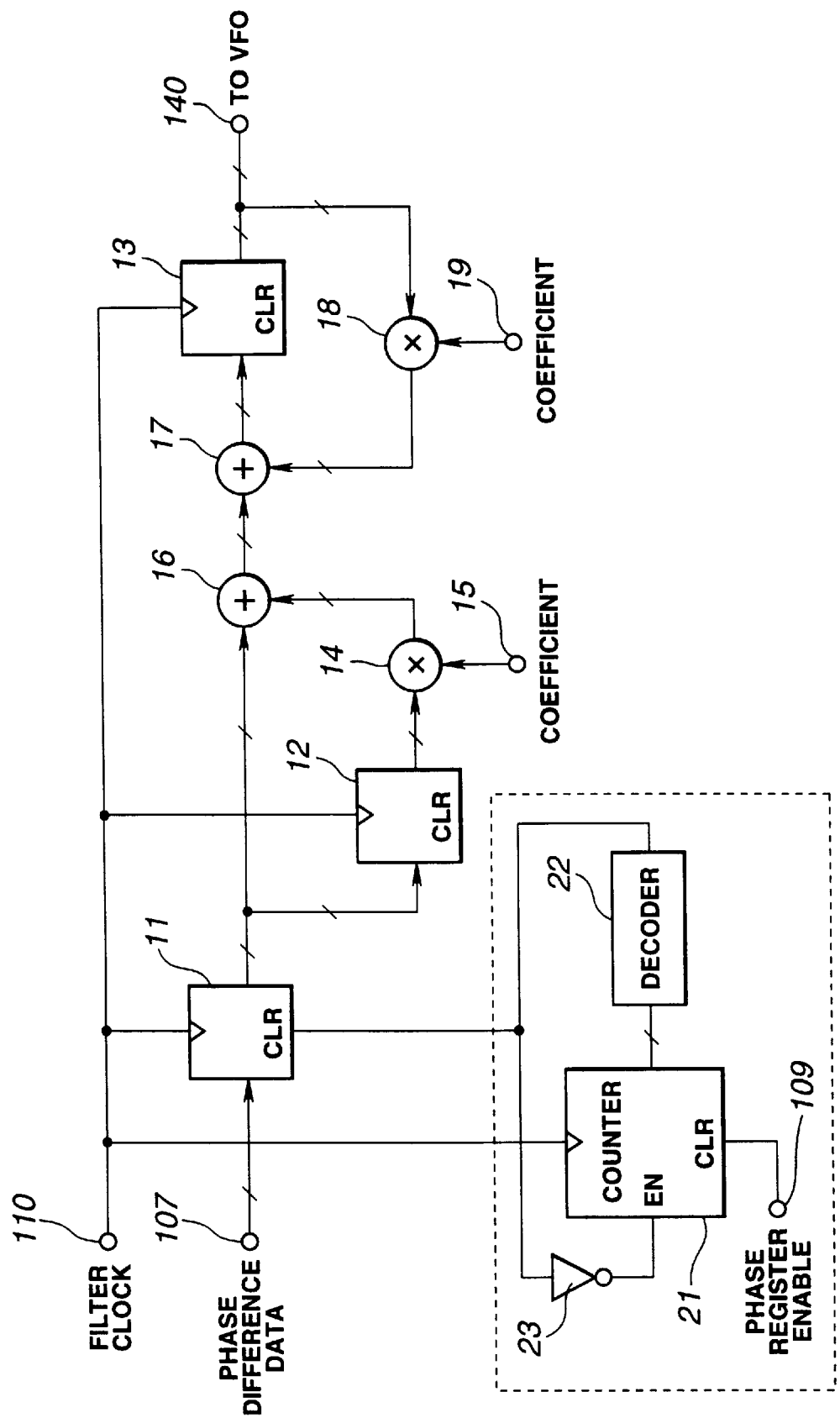
FIG. 6 is a block diagram showing an internal arrangement of a low-pass filter 103 shown in FIG. 5 to which the present invention applies.

The digital LPF 103 is arranged as shown in FIG. 6. As shown, the digital LPF 103 is arranged to have a register 11 on an input side and registers 12 and 13. That is, the phase difference data supplied through a terminal 107 is sent to the register 12 and an adder 16 through the register 11. The output from the register 12 is multiplied by a coefficient from the terminal 15 through the effect of a multiplier 14 and then is sent to the adder 16. The output from an adder 16 is sent to an adder 17. The output from the adder 17 is sent to a multiplier 18 through the register 13 in which multiplier the output is multiplied by a coefficient from a terminal 19. The multiplied result is fed back to the adder 17. The output from the register 13 is taken out as an LPF output at a terminal 140. These registers 11, 12 and 13 are driven on a filter clock from a terminal 110. The filter clock corresponds to both edges of the PLL output clock PLCK, for example.

The defect detecting circuit 20 is arranged to have a counter 21, a decoder 22, and an inverter 23 and operates to output a detection signal when the phase register clock supplied through the terminal 109 cannot be detected for a given time. That is, the counter 21 performs a counting operation with the filter clock as an input clock and is cleared by the clock of the phase register. A decoder 22 operates to output a detection signal for "H" (High-level) when a count value from the counter 21 reaches a predetermined value Th. The detection signal is supplied to an enable terminal EN of the counter 21 through an inverter 23 so that the detection signal serves to stop the counting operation of the counter 21. The defect detection signal from the decoder 22 is supplied to a clear terminal CLR of an input-stage register 11 of the digital filter circuit. If the detection signal is at "H", the content of the register 11 is cleared by the detection signal.

When the defect of the medium disallows an edge of an input signal to the PLL circuit shown in FIG. 5 to be detected, the phase comparator shown in FIG. 2 stops to output the phase register clock. When the counter 21 shown in FIG. 6 counts up to a count value Th corresponding to a predetermined time, the decoder 22 outputs a "H" signal by which the defect is detected. By detecting a defect, the input-stage register 11 of the filter is reset. The counting operation of the counter 21 is stopped and the count value is held and the output from the decoder 22 is kept "H" until the next phase register clock is inputted, so that the input-stage register 11 is kept reset, which is equivalent to the fact that the LPF input is kept zero. Hence, the output from the LPF 103 is progressively changed to zero and the VFO 104 is oscillated at a certain reference frequency, for example, a channel bit clock frequency of the input EFM signal. In the oscillating state at the reference frequency, when the normal reproducing state is returned after the light pickup passes a defect portion of the medium, the PLL circuit operates to quickly do a pull-in.

In turn, the description will be oriented to another arrangement of the LPF circuit and the defect detecting circuit used in the PLL circuit according to an embodiment of the present invention. The corresponding components of FIG. 7 to those of FIG .6 have the same reference numbers. Hence, the description of the corresponding components is left off the description.

Figure 7:
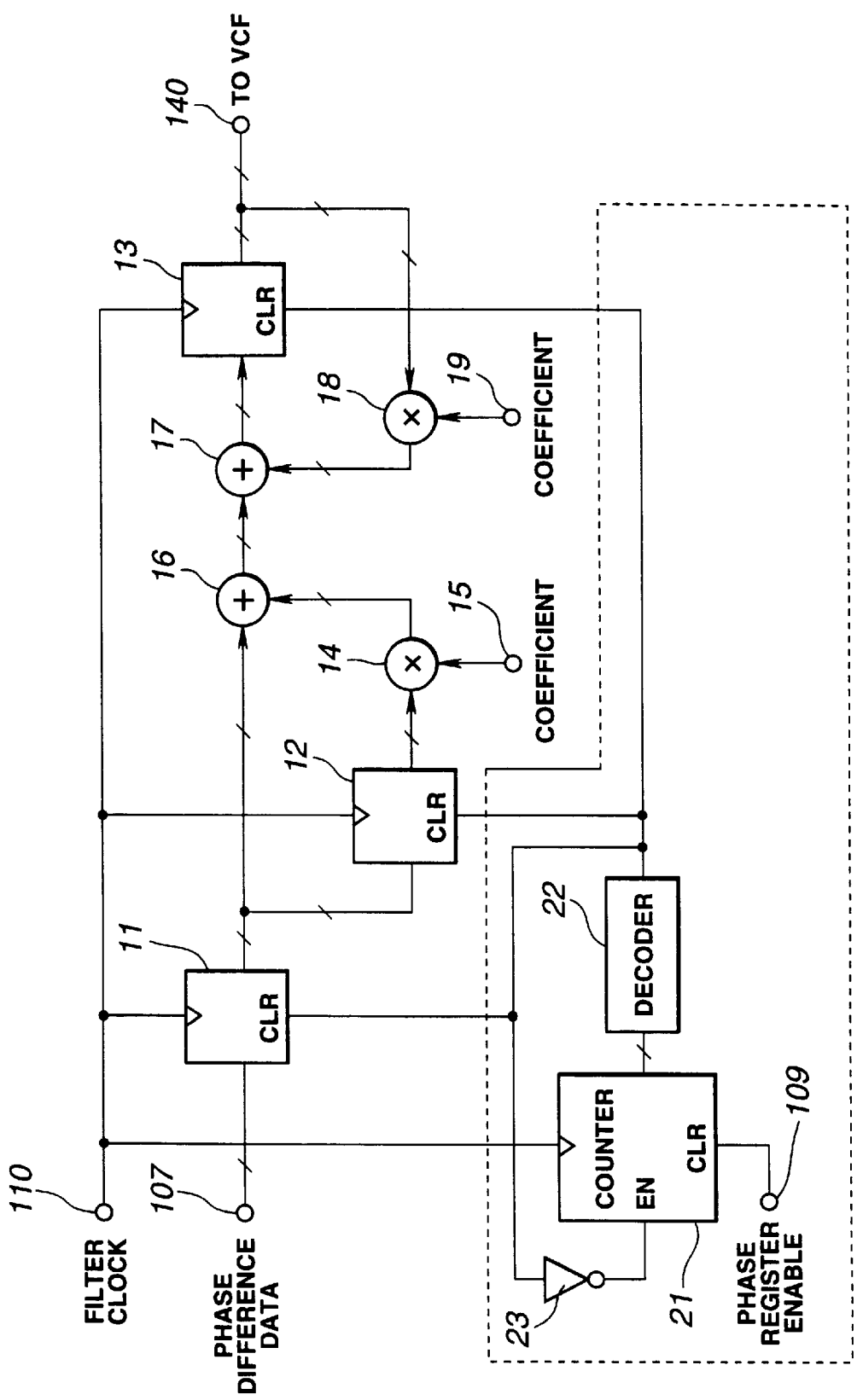
FIG. 7 is a block diagram showing an internal arrangement of a low-pass filter 103 shown in FIG. 5 to which the present invention applies.

In FIG. 7, the defect detection signal from a decoder 22 of the defect detection circuit, that is, a register clear signal is sent to the input-stage register 11 of the digital LPF as well as the remaining two registers 12 and 13. By this signal, the LPF is completely reset and supplies an output of zero, when the frequency of the VFO 104 is fixed to the reference frequency.

According to the arrangement shown in FIG. 7, when a defect is detected, the filter of the PLL circuit is completely reset and supplies an output of zero, when the oscillating frequency is fixed to the reference frequency. By this operation, the pull-in of the PLL is more quickly executed after the optical pickup is departed from the defect of the medium.

Figure 8:
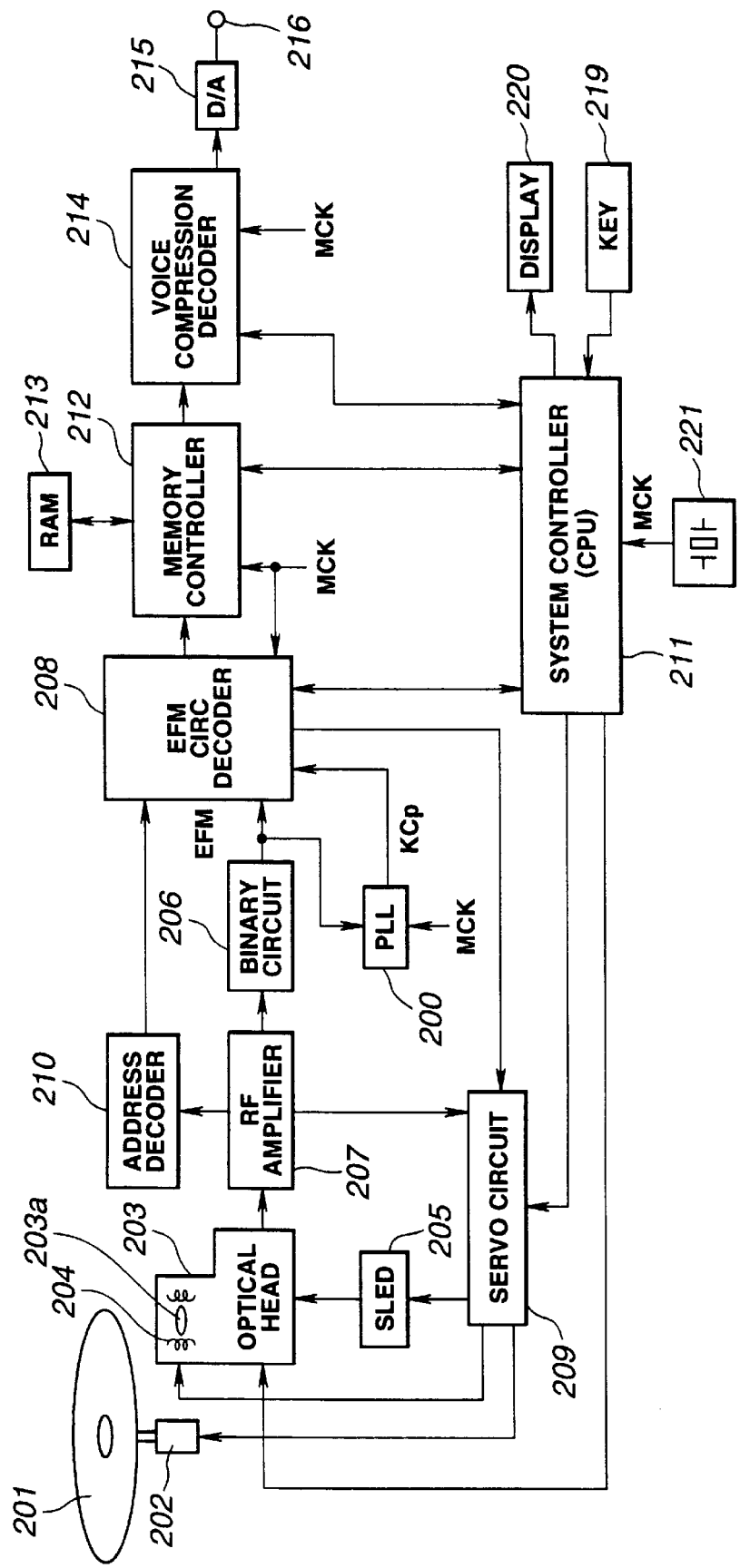
FIG. 8 is a block diagram showing an overall arrangement of a reproducing apparatus to which the PLL circuit applies.

Next, FIG. 8 shows a concrete arrangement of a signal reproducing apparatus arranged to use the PLL circuit according to an embodiment of the invention. Such a PLL circuit 200 as having been described with reference to FIGS. 5 to 7 is inputted with an EFM signal from a binary circuit 206. The output clock CKp from the PLL circuit 200, that is, the PLL output clock PLCK shown in FIGS. 5 to 7 are sent to the EFM and CIRC decoder 208. CIRC denotes a Cross Interleave Reed-Solomon Code. In place of this CIRC, an ACIRC (Advance CIRC) may be used, which is an improvement of the CIRC.

In FIG. 8, an optical disk 201 for audio is rotatively driven by a motor 202 for rotating a disk such as a spindle motor. A signal recorded on this optical disk 201 is read by an optical pickup head 203 served as a reproduction head and amplified by a so-called RF amplifier 207.

The optical pickup head 203 operates to apply a laser beam onto the optical disk 201 and detect the reflected light for reproducing a signal from the disk. The optical pickup head 203 provides a laser diode for feeding a laser, an optical system composed of a polarizing beam splitter and an objective lens, and a photo detector for detecting a reflected light. The objective lens 203a is supported so that it may be displaced in the radial direction (tracking direction) of the disk and the optical axis direction (focusing direction) by a two-axes actuator 204. This optical pickup head 203 can be movable in the radial direction of the disk through the effect of a so-called sledding mechanism 205.

The signal read from the optical disk through the optical pickup head 203 is sent to the RF amplifier 207. The RF amplifier 207 performs an operating treatment with respect to the signal for the purpose of extracting a reproduced RF signal, a tracking error signal, and a focus error signal.

The reproduced RF signal is binarized into the foregoing EFM signal through the effect of the binary circuit 206. Then, the EFM signal is supplied to the EFM and CIRC decoder 208. The EFM signal is supplied to a PLL circuit 200 having the arrangement described with reference to FIGS. 5 to 7. The PLL circuit 200 operates to supply a reproduced clock CKp in synchronous with the clock component of the EFM signal. The reproduced clock CKp corresponds to the PLL output clock PLCK as indicated in FIGS. 5 to 7. The reproduced clock CKp is supplied to the EFM and CIRC decoder 208. The clock CKp is used as a reference clock on which the inputted EFM signal is decoded.

As described above, it goes without saying that the PLL circuit 200 operates to reset the resistor of the internal digital LPF for setting the oscillating frequency of the VFO to a reference frequency when no edge of the EFM signal is detected because of a defect of the optical disk 201. This operation makes it possible to expedite the PLL pull-in after the optical pickup unit is off the defect of the optical disk 201.

In the case of using the magneto-optical disk as the optical disk 201, the RF amplifier 207 operates to extract the groove information that corresponds to the absolute position information recorded as the so-called pre-groove. This groove information is sent to an address decoder 210. The address decoder 210 operates to generate the absolute position information and the address bit clock from the groove information and then supply them to the EFM and CIRC decoder 208. This absolute position information is supplied to a system controller 211 composed of a microcomputer or the like. For the optical disk dedicated to reproduction, the EFM and CIRC decoder 208 reads the address and the accessary subcode information recorded as data and supplies the address information and the subcode data used for control to the system controller 211. The system controller 211 uses the address information and the control information for various kinds of controls.

The tracking error signal and the focus error signal extracted by the RF amplifier 207 are supplied to a servo circuit 209. The servo circuit 209 operates to generate various kinds of servo signals including the tracking error signal inputted thereto, the focus error signal also inputted thereto, a track jump instruction sent from the system controller 211, an access instruction, and rotation speed detection information of the motor 202. With those servo signals, the servo circuit 209 controls a two-axes actuator 204 and a sledding mechanism 205 for doing focus or tracking control or head-feeding control. Further, based on a CLV servo signal from the EFM and CIRC decoder 208, the servo circuit 209 controls the rotation of the motor 202, e.g., in a CLV (constant linear velocity) manner. In place, the rotation may be controlled in a CAV (constant angular velocity) manner.

The EFM and CIRC decoder 208 performs an EFM modulation and decoding processes for an error-correcting decode and a sector decode with respect to the EFM signal. Then, the processed EFM signal is written to and read out of the buffer memory 213 under the control of the memory controller 212. The buffer memory 213 employs a 4M-bit or 16M-bit D-RAM, for example.

The data read out of the buffer memory 213 under the control of the memory controller 212 is expanded into a digital audio signal by an audio compression decoder 214 if necessary. The digital audio signal is sent to a digital-to-analog converter 215 in which the signal is converted into an analog audio signal. Then, the analog audio signal is taken at an output terminal 216.

An operation signal sent from a keying unit 219 is sent to the system controller 211. A numeral 220 denotes a display unit that operates to display information such as an operating state and a reproducing time sent from the system controller 211. The oscillator 221 generates the master clock MCK. Then, the master clock MCK is supplied to the system controller 211 and various required components.

The present invention is not limited to the foregoing embodiments. For example, in a case that the dc value is set to a non-zero predetermined value when the oscillating frequency of the VFO is changed into the reference frequency, the phase difference count of the phase comparator starts from zero, and the predetermined value is outputted as the phase difference data when the phase difference is zero, the predetermined value may be loaded to each register of the digital LPF when a defect is detected. Further, it goes without saying that the arrangement of the defect detector is not limited to the illustrative embodiments but may be modified in various forms without departing from the spirit of the present invention.

As has been obvious from the foregoing description, according to the present invention, the PLL circuit has been arranged to compare the input signal in phase with the PLL output signal, take the low-pass component of the compared output with a filter, variably control the oscillating frequency of the variable frequency oscillator and control the filter in the constant state when detecting a defect of the input signal. Hence, when the defect is detected, the PLL circuit operates to keep the oscillating frequency of the PLL constant and expedite the PLL pull-in when the optical pickup unit departs from the defective point on the optical disk.

The defect detection is determined by obtaining no edge of the input signal for a certain time. The digital filter composed of plural registers, which is served as filtering means, is used for resetting an input-side register or all the registers when detecting the defect. This makes it possible to prevent a large dc value from being stored in the PLL filter when the defect is detected, keep the oscillating frequency as a reference frequency, and expedite the PLL pull-in when the pickup unit departs from the defect on the disk.

Moreover, a signal reproducing apparatus having this kind of PLL circuit for feeding a clock for signal reproduction is provided for suppressing a damage of the reproduced data to a minimum.

In the claims:

1. A phase locked loop circuit comprising:
   means for comparing in phase an input signal with a generated clock signal and producing a phase difference signal;
   means for extracting a low-pass signal from said phase difference signal;
   means for varying an oscillating frequency in response to said low-pass signal extracted by said means for extracting a low-Pass signal;
   means for feeding an output from said means for varying an oscillating frequency as said generated clock signal;
   means for detecting a loss of said input signal; and
   means for controlling said low-pass signal output from said means for extracting a low-pass signal to be zero when said means for detecting detects said loss of said input signal.

2. The phase locked loop circuit as claimed in claim 1, wherein said means for extracting a low-pass signal includes a digital filter having multi-stage registers and one of said multi-stage registers being fed said phase difference signal is reset by said control means to keep said low-pass signal output from said means extracting a low-pass signal at zero when said means for detecting detects said loss of said input signal.

3. A reproducing apparatus for producing a binarized signal from a signal reproduced from a recording medium and for extracting a clock signal from said binarized signal, comprising:
   means for comparing in phase said binarized signal with a generated clock signal and producing a phase difference signal;
   means for extracting a low-pass signal from said phase difference signal;
   means for variably controlling an oscillating frequency in response to said low-pass signal extracted by said means for extracting a low-pass signal;
   means for feeding an output of said means for variably controlling an oscillating frequency as said generated clock signal;
   means for detecting a loss of said binarized signal; and
   means for controlling said low-pass signal output from said means for extracting a low-pass signal to be zero when the loss of said binarized signal is detected by said means for detecting.

4. The reproducing apparatus as claimed in claim 3, wherein said means for extracting a low-pass signal includes a digital filter having multi-stage registers and one of said multi-stage registers being fed said phase difference signal is reset by said control means to keep said low-pass signal output from said means for extracting a low-pass signal at zero when said means for detecting detects said loss of said binarized signal.

\* \* \* \* \*